US006770919B2

(12) United States Patent
Feng et al.

(10) Patent No.: US 6,770,919 B2
(45) Date of Patent: Aug. 3, 2004

(54) INDIUM PHOSPHIDE HETEROJUNCTION BIPOLAR TRANSISTOR LAYER STRUCTURE AND METHOD OF MAKING THE SAME

(75) Inventors: Milton Feng, Champaign, IL (US); Shyh Chiang, Champaign, IL (US); David C. Caruth, Urbana, IL (US)

(73) Assignee: XINDIUM Technologies, Inc., Champaign, IL (US)

( * ) Notice: Subject to any disclaimer, the term of this patent is extended or adjusted under 35 U.S.C. 154(b) by 0 days.

(21) Appl. No.: 10/330,484

(22) Filed: Dec. 30, 2002

(65) Prior Publication Data

US 2004/0124436 A1 Jul. 1, 2004

(51) Int. Cl.[7] .............................................. H01L 29/737
(52) U.S. Cl. ...................................... 257/197; 257/200
(58) Field of Search ................................ 257/197–198, 257/200–201

(56) References Cited

U.S. PATENT DOCUMENTS

| | | | |
|---|---|---|---|
| 5,206,524 A | * | 4/1993 | Chen et al. .................... 257/29 |
| 5,318,916 A | | 6/1994 | Enquist et al. |
| 5,412,249 A | | 5/1995 | Hyugaji et al. |
| 5,557,117 A | * | 9/1996 | Matsuoka et al. .......... 257/184 |
| 5,580,382 A | | 12/1996 | Jackson et al. |
| 5,656,538 A | | 8/1997 | Gardner et al. |
| 5,682,046 A | | 10/1997 | Takahashi et al. |
| 5,684,308 A | | 11/1997 | Lovejoy et al. |
| 6,143,997 A | | 11/2000 | Feng et al. |
| 6,465,804 B1 | * | 10/2002 | Shamir et al. ................ 257/25 |

FOREIGN PATENT DOCUMENTS

JP          09064054 A  *  3/1997  ......... H01L/21/331

OTHER PUBLICATIONS

Shoji Yamahata et al., "Over–220 . . . Double–Heterojunction Bipolar Transistors with a New Hexagonal–Shaped Emitter," Session E, IEEE 1995, pp. 163–166.

D. Huber et al., "InP–InGaAs Single HBT Technology for Photoreceiver OEIC's at 40 Gb/s and Beyond," Journal of Lightwave Technology, vol. 18, No. 7, Jul. 2000, pp. 992–1000.

Madjid Hafizi, "New Submicron HBT IC Technology Demonstrates Ultra–Fast, Low–Power Integrated Circuits," IEEE Transactions On Electron Devices, vol. 45, No. 9, Sep. 1998, pp. 1862–1868.

(List continued on next page.)

Primary Examiner—Allan R. Wilson
(74) Attorney, Agent, or Firm—Mckenna Long & Aldridge LLP

(57) ABSTRACT

An expitaxial layer structure that achieves reliable, high speed, and low noise device performance in indium phosphide (InP) based heterojunction bipolar transistors (HBTs) for high data rate receivers and optoelectronic integrated circuits (OEIC). The layer consists of an n+ InGaAs subcollector, an n+ InP subcollector, an unintentionally doped InGaAs collector, a carbon-doped base, an n-type InP emitter, an n-type InGaAs etch-stop layer, an n-type InP emitter, and anInGaAS cap layer.

20 Claims, 12 Drawing Sheets

OTHER PUBLICATIONS

M. T. Fresina, et al., "Selective Self-Aligned Emitter Ledge Formation for Heterojunction Bipolar Transistors," IEEE Electron Device Letters, vol. 17, No. 12 Dec. 1996, pp. 555–556.

P. Lorenzini et al., "Luminescence and Reflectivity of GaN/sapphire grown by MOVPE, GSMBE and HVPE," Text of MIJ–NSR, vol. 1, Article 25, Jan. 1998, pp. 1–3.

Yoram Betser, et al., "Optical Communications: Readying receivers for 40–Gbps operation," GaAsNET—The GaAs Electronics Industry Resource, Aug. 2001, pp. 1–7.

Q. Lee et al., "A>400 GHz $f_{max}$ Transferred–Substrate Heterojunction Bipolar Transistor IC Technology," IEEE Electron Device Letters, vol. 19, No. 3, Mar. 1998, pp. 77–79.

* cited by examiner

INDIUM PHOSPHIDE HETEROJUNCTION BIPOLAR TRANSISTOR LAYER STRUCTURE AND METHOD OF MAKING THE SAME

BACKGROUND OF THE INVENTION

1. Field of the Invention

The present invention relates to the growth of an epitaxial layer structure in heterojunction bipolar transistor (HBT) technology. More specifically, the invention employs a double-etch-stop ledge (DESL) structure in the emitter and base junction on an indium phosphide (InP) based HBT.

2. Discussion of the Related Art

In manufacturing three-terminal vertical devices, such as a heterojunction bipolar transistor (HBT), collector, base and emitter layers are successively deposited on a substrate using epitaxial technology. Epitaxial technologies such as metal-organic molecular beam epitaxy (MOMBE), gas-source molecular beam epitaxy (GSMBE), and metal-organic chemical vapor deposition (MOCVD) are well known. Such epitaxial technologies are particularly useful for producing multi-layered structures. The advantages of HBT technology over high-electron mobility field effect transistor (HEMT) technology are simpler multi-layered structures, the ability to integrate directly with optical devices such as p-intrinsic-n (PIN) diodes, better uniformity, less stringent feature-size requirement, smaller chip area, large scale integrability, and hence, a lower fabrication processing cost. Such multi-layered structures employ an InP technology which has become a well-recognized viable technology for next generation high speed long-wavelength optical communication systems. Its applications in optoelectronic integrated circuits (OEIC) include front-end transmitters, receivers, and clock and data recovery (CDR) integrated circuits (ICs).

Indium phosphide systems are preferred over gallium arsenide (GaAs) based HBT material systems because of their higher frequency response due to the faster electron saturation velocity in indium-containing materials such as indium gallium arsenide (InGaAs). The lower surface recombination velocity in InGaAs material is also advantageous when InP HBT devices are scaled down to the submicron regime. Superior high-frequency InP HBT performance with characteristics including a transit frequency, $f_T$ of over 220 GHz and an oscillation frequency, $f_{Max}$ of greater than 400 GHz have been demonstrated using a wet-etching. See for example, Yamahata, S. et al., "Over 220 GHz $f_T$ and $f_{Max}$ InP/InGaAs Double-Heterojunction Bipolar Transistors with a New Hexagonal-Shaped Emitter," 17th Annual GaAs IC Symposium, Tech. Dig., , pp. 163–166, 1995 and Lee, Q. et al., "A >400 GHz $f_{Max}$ Transferred-Substrate Heterojunction Bipolar Transistor IC Technology," IEEE Electron Device Lett., vol. 19, pp. 77–79, 1998.

The problems encountered in InP HBT technologies include the unknown device reliability and the inability to lower noise performance. Various approaches have been used to grow conventional InP HBT structures employing DESL structure. See for example, Bitter, M. et al., "Monolithic InGaAs/InP pin/HBT Optical Receiver Front-End Module for Data rates up to 40-Gb/s," Indium Phosphide and Related Materials Conference in Davos, Switzerland, p. 31, 1999, Huber, D. et al., "InP-InGaAs Single HBT Technology for Photoreceiver OEICs at 40 Gb/s and Beyond," J. of Lightwave Technology, vol. 18, no. 7, pp.992–1,000, 2000, and Hafizi, M., "New Submicron HBT IC Technology Demonstrates Ultra-Fast, Low-Power Integrated Circuits," IEEE Electron Device Lett., vol.45, no. 9, pp. 1862–1868, 1998.

Designers of 40-Gbps systems can select devices manufactured using indium phosphide (InP) heterojunction bipolar transistor (HBT) technology. InP is a promising technology that is growing in popularity due to its RF performance, which is greater than 150 GHz $f_T$ and $f_{Max}$ at moderate to high current densities (50 to 100 kA/cm2). The $f_T$ is high because of the thin base and collector layers employed in the epitaxial structure of the device. Thinner layers give rise to fast transit times for electrons in the base and collector that in turn enable a high $f_T$. Also, scaling of the devices (especially by narrowing the emitter stripe together with heavily doping the base) significantly reduces the value of the base resistance, which in turn leads to high values of $f_{Max}$. As a consequence of its high $f_T$ and fMax, InP HBT structures can offer performance margin in 40-Gbps transmission systems.

SUMMARY OF THE INVENTION

Accordingly, the present invention is related to InP-based HBTs using a double-etch-stop ledge structure in the emitter-base junction.

An advantage of the present invention is to provide an epitaxial layer structure that may potentially achieve reliable, high speed, and low noise device performance in InP-based HBTs for high data rate receivers and OEICs.

Another advantage of the present invention is to provide an epitaxial layer structure that enables a robust and highly manufacturable wet-etching InP HBT fabrication process using well-known selective etching techniques.

A further advantage of the present invention is to provide minimized surface recombination current at the exposed emitter-base junction, and, hence, maintain the reasonable current gain as the HBT devices are scaled down to the sub-micron regime.

Another advantage of the present invention is that the thin alloy-through emitter layer that is sandwiched between the InGaAs base layer and the n-type InGaAs emitter etch-stop layer can be preserved for base metal alloy-through purposes.

To achieve these and other advantages and in accordance with the purpose of the present invention, as embodied and broadly described, an indium phosphide heterojunction bipolar transistor layer structure formed on an InP substrate includes: an n+ InGaAs sub-collector; an n+ InP sub-collector; an unintentionally-doped InGaAs collector; a carbon-doped base; an n-type InP emitter; an n-type InGaAs etch-stop layer; an n-type InP emitter; and a InGaAs cap layer.

In another aspect of the invention, a method of making an indium phosphide heterojunction bipolar transistor layer structure on an InP substrate includes forming a first InGaAs layer having a first doping concentration; forming a first InP layer having a first doping concentration; forming a second InGaAs layer; forming a layer doped with carbon having a second doping concentration;

forming a second InP layer having a first doping concentration; forming a third InGaAs layer having a first doping concentration; forming a third InP layer having a first doping concentration; and forming a fourth InGaAs layer.

Additional features and advantages of the invention will be set forth in the description that follows, and in part will be apparent from that description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, the example of which is shown in the accompanying drawings.

Figure 1A:
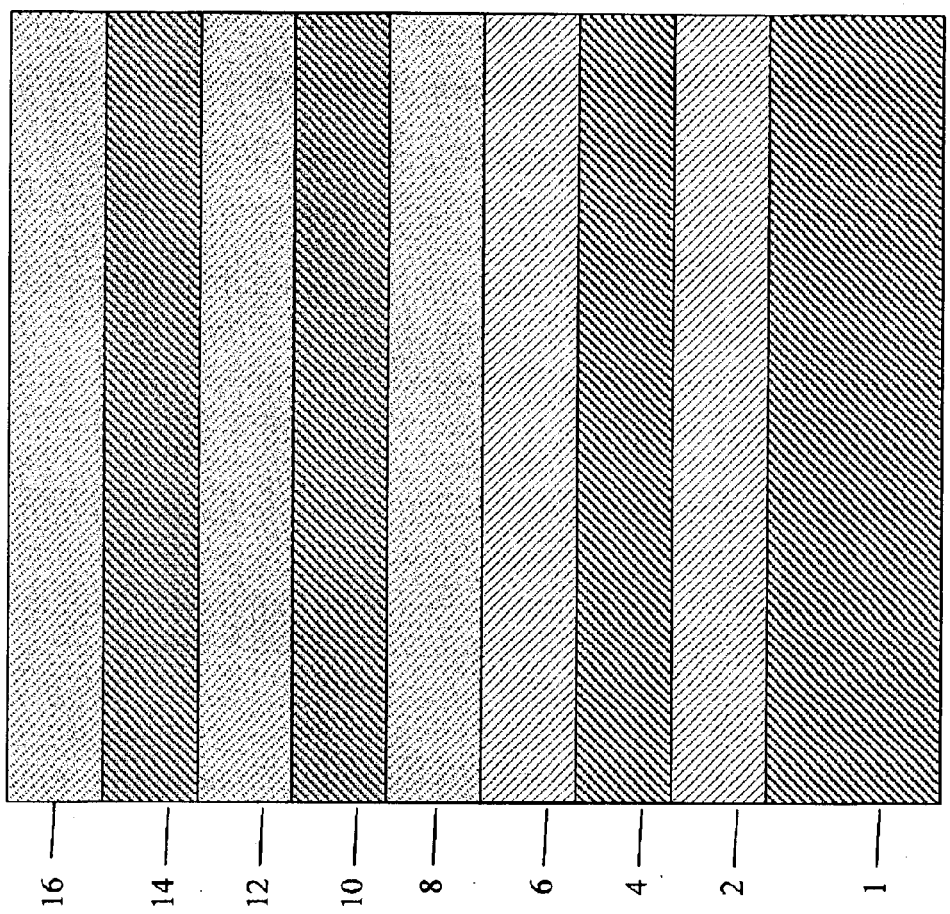
FIG. 1A illustrates an epitaxial layer structure for an InP HBT according to an embodiment of the invention.
Figure 1B:
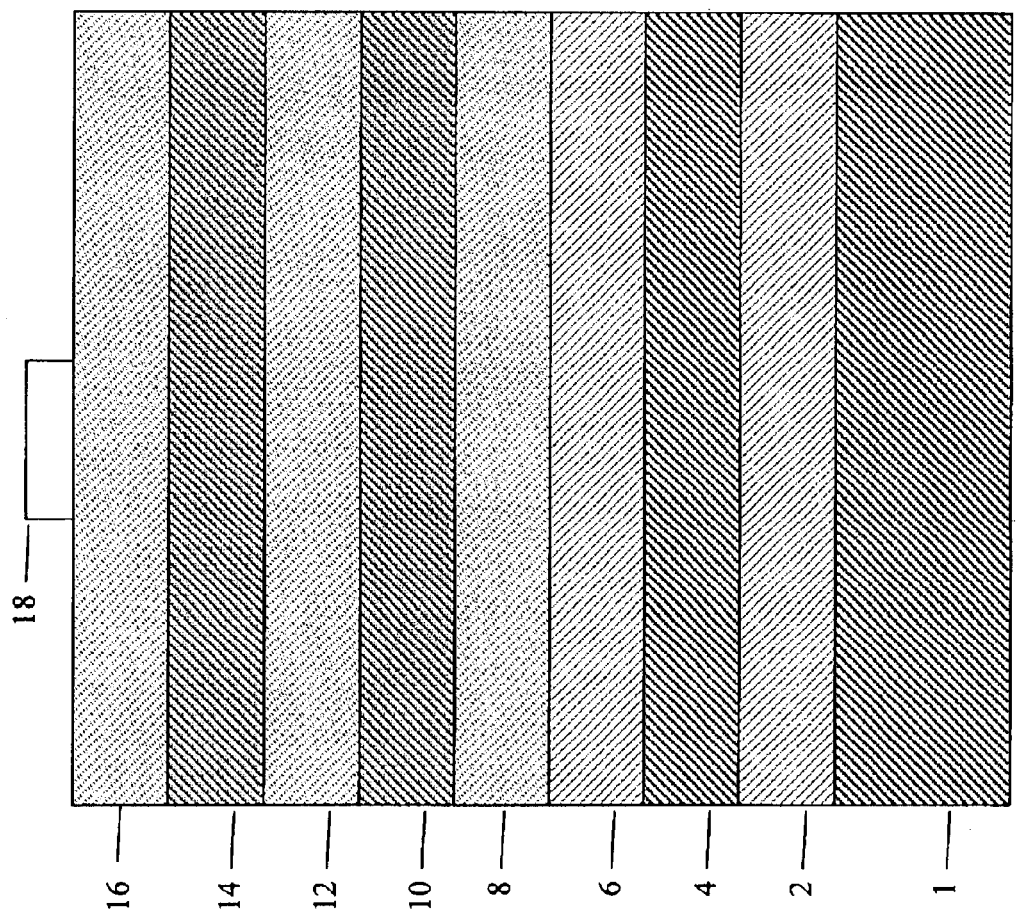
FIG. 1B illustrates an emitter contact deposited on the layer structure.

FIGS. 1A–1F schematically illustrate the process steps for fabrication of the InP HBT according to the present invention. The layer structure will provide a uniform all-wet-etching HBT process. In FIG. 1A show the original layers prior to etching. An emitter layer 14, base layer 8 and collector layer 6 are formed on top of a substrate 1. In FIG. 1B, a metal emitter contact 9 is formed on the surface of the emitter layer 14 by deposition using thermal or e-gun evaporation in a vacuum system. Substrate 1 is made of InP material, collector layer 6 is an InGaAs layer of approximately 5,000 Å in thickness, base layer 8 is a layer about 450 Å thick made of InGaAs material, and emitter layer 14 is a layer about 200 Å thick made of InP, although other thicknesses and materials are possible.

The exemplary doping levels are listed in Table 1, but variations are possible for fine tuning of device performance.

| Layer No. | Material | Mole Fraction | Thickness (Å) | Type | Concentration (cm$^{-3}$) |
|---|---|---|---|---|---|
| 16 | In(x)GaAs (emitter cap) | X = 0.53 | 1500 | N+ | 1E19 |
| 14 | InP (emitter) | | 200 | N+ | 5E18 |
| 12 | (In(x)GaAs (emitter etch-stop) | X = 0.53 | 50 | N | 5E17 |
| 10 | InP (alloy-through emitter) | | 300 | N | 5E17 |
| 8 | In(x)GaAs (base) | X = 0.53 | 450 | P (carbon) | 4E19 |
| 6 | (In(x)GaAs (collector) | X = 0.53 | 5,000 | N | 1E16 |
| 4 | InP (collector etch-stop) | | 200 | N+ | 5E18 |
| 2 | (In(x)GaAs (sub-collector) | X = 0.53 | 5,000 | N+ | 1E19 |
| 1 | InP Substrate | | | | |

The layer structure is grown on top of a semi-insulating InP substrate 1 using well-known epitaxial technologies such as MOMBE, GSMBE, and MOCVD.

Figure 1C:
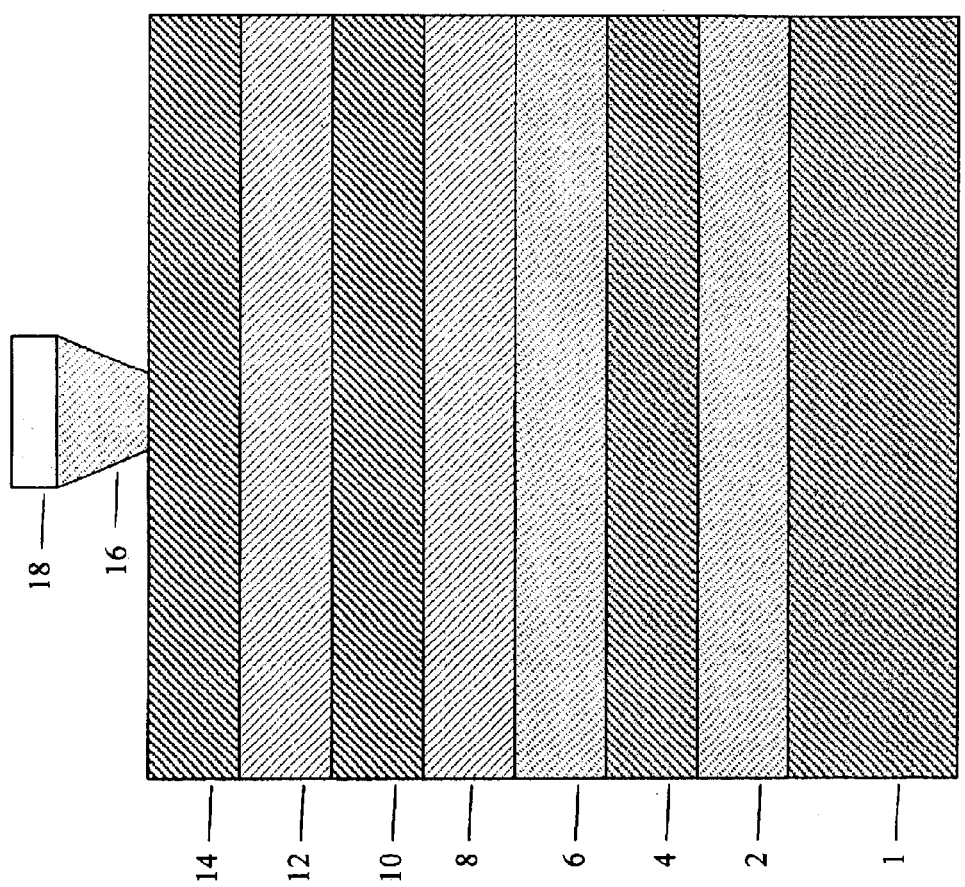
FIG. 1C illustrates the InGaAs emitter cap layer after etching.
Figure 1D:
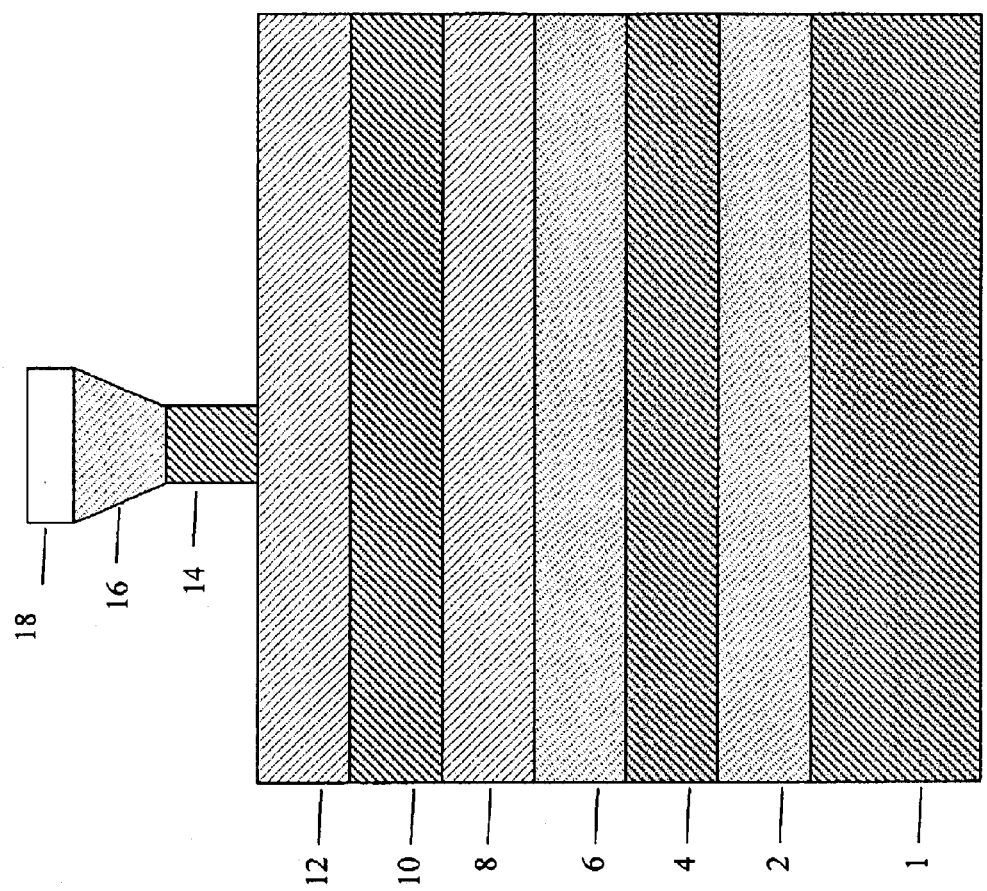
FIG. 1D illustrates the InP emitter layer after etching.
Figure 1E:
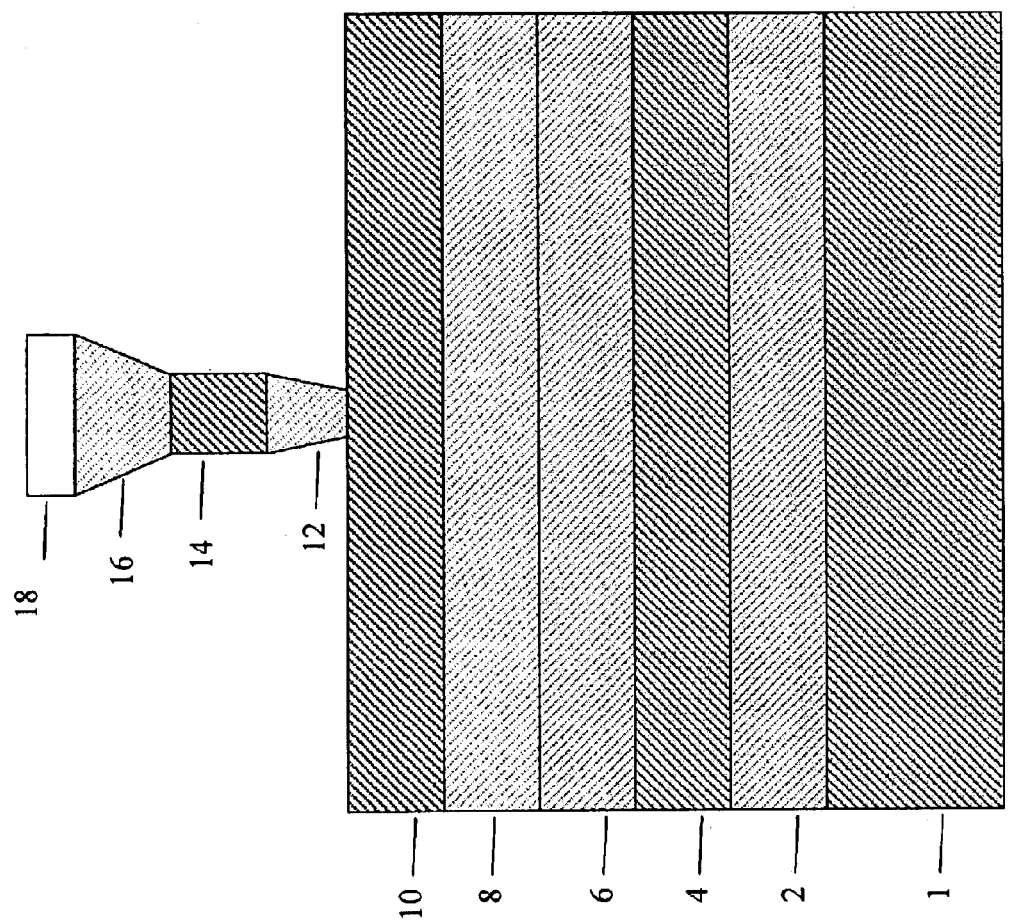
FIG. 1E illustrates the InGaAs emitter etch-stop layer after etching.

As shown in FIGS. 1C–1E, the emitter layers are then etched using a selective etching solution. The emitter layers include an InGaAs emitter cap 16 about 1500 Å in thickness, an InP emitter layer 14 about 200 Å thick, an InGaAs emitter etch stop layer 12 about 50 Å in thickness, and an InP alloy-through emitter layer 10 about 300 Å thick. The selective etching of InGaAs over InP is achieved by using citric-acid or sulfuric acid ($H_2SO_4$)-based solutions; the selective etching of InP over InGaAs is achieved using hydrochloric-acid (HCl)-based solutions. These selective etching solutions are well-known.

Figure 1F:
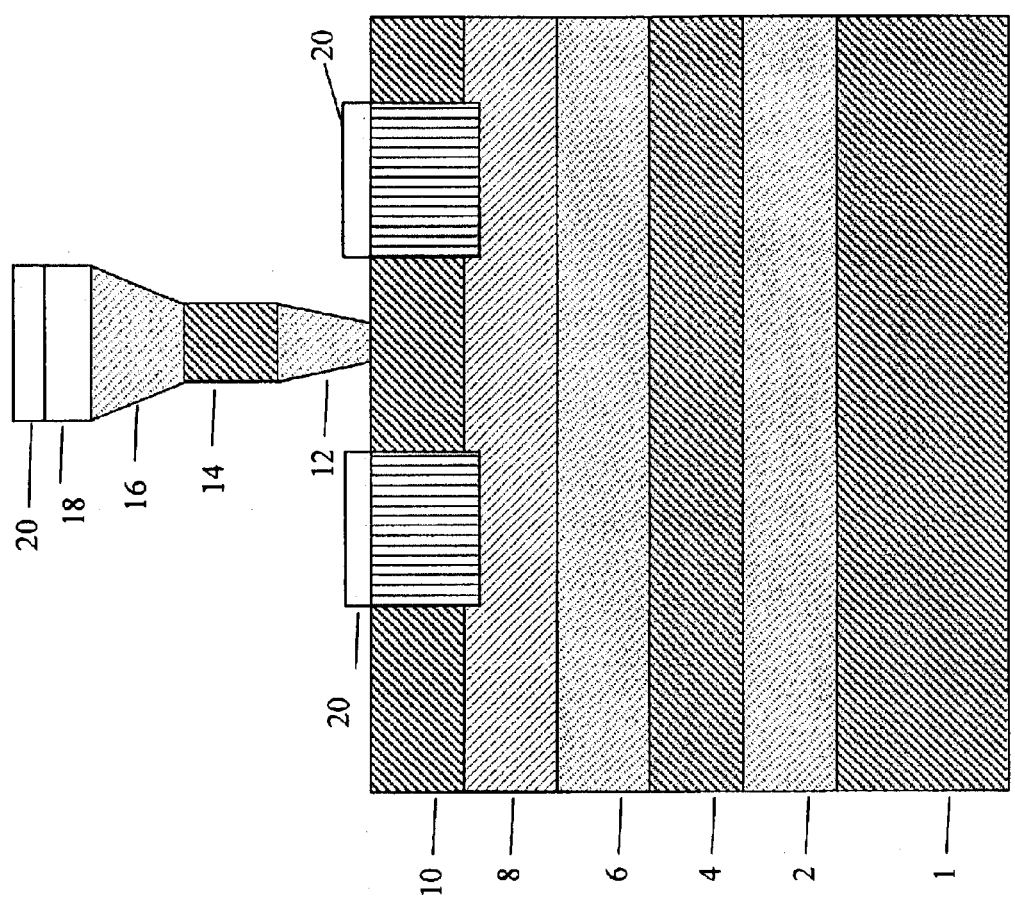
FIG. 1F illustrates a self-aligned base contact applied to the InP alloy-through emitter layer following the emitter etch.

Following the emitter etch, a self-aligned base contact 18 is applied as shown in FIG. 1F. This layer structure is versatile in terms of fabrication processes since it can facilitate either the alloy-through process or the DESL process as shown in FIG. 3A and FIG. 3B. Previously, it was discovered that the alloy-through base presents a lower noise figure than a non-alloy-through base in GaAs-based HBTs. See Fresina, M. et al., "Selective Self-Aligned Emitter Ledge Formation for Heterojunction Bipolar Transistors," IEEE Electron Device Lett., vol. 17no. 12, pp. 555–556, 1996.

Using the DESL process, results show a current gain of 75, $f_T$ of 110 GHz, and $f_{Max}$ of 150 GHz with 30 $\mu m^2$ emitter and base doping of less than 2E 19 cm$^{-3}$.

In the alloy-through process, the base contact 18 is formed on the thin emitter layer 10. Following the metal deposition, an alloy process is performed to make ohmic contacts with the base layer 8. The exposed thin InP alloy-through emitter 10 is then depleted. The depleted emitter layer provides a further reduction in surface recombination current in an HBT. In DESL processing, the non-alloyed base contact 18 is formed directly on top of the base layer 4, resulting in a much simpler fabrication processing step.

Figure 2A:
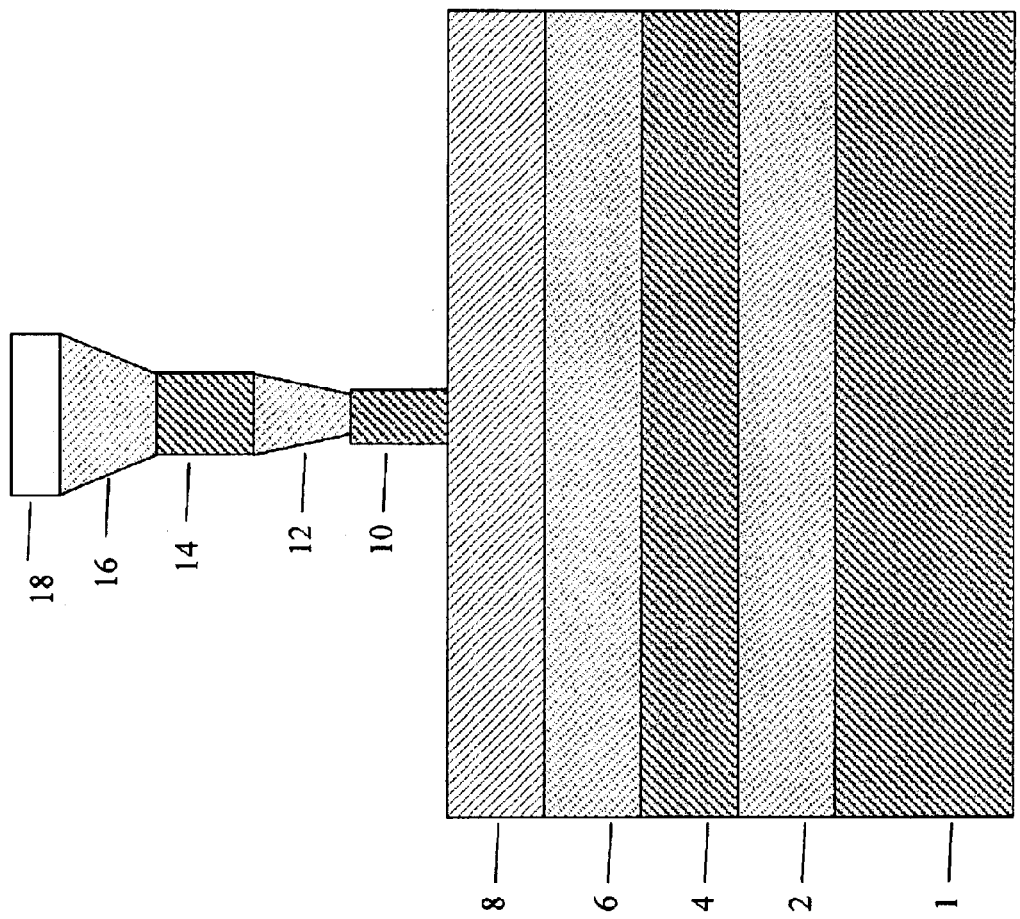
FIG. 2A illustrates the depiction of the thin InP emitter layer.
Figure 2B:
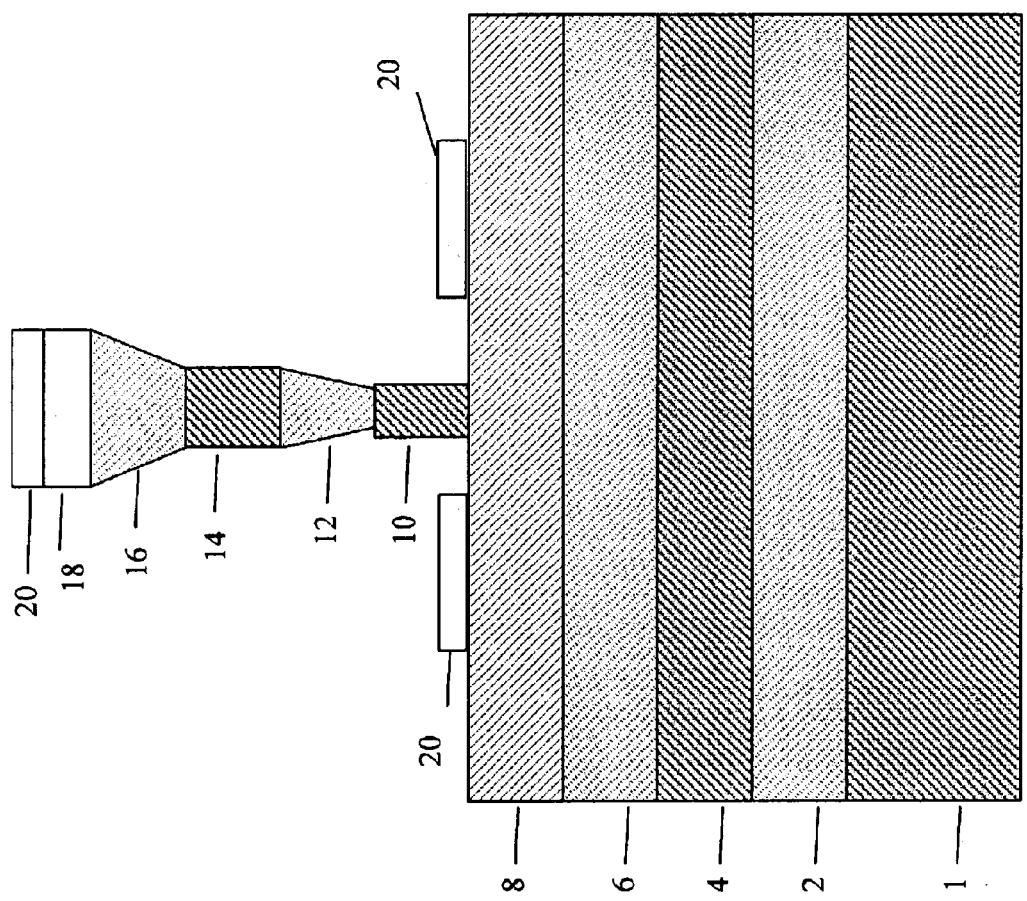
FIG. 2B illustrates non-alloyed base contact formed on the top of the InGaAs base layer.
Figure 2C:
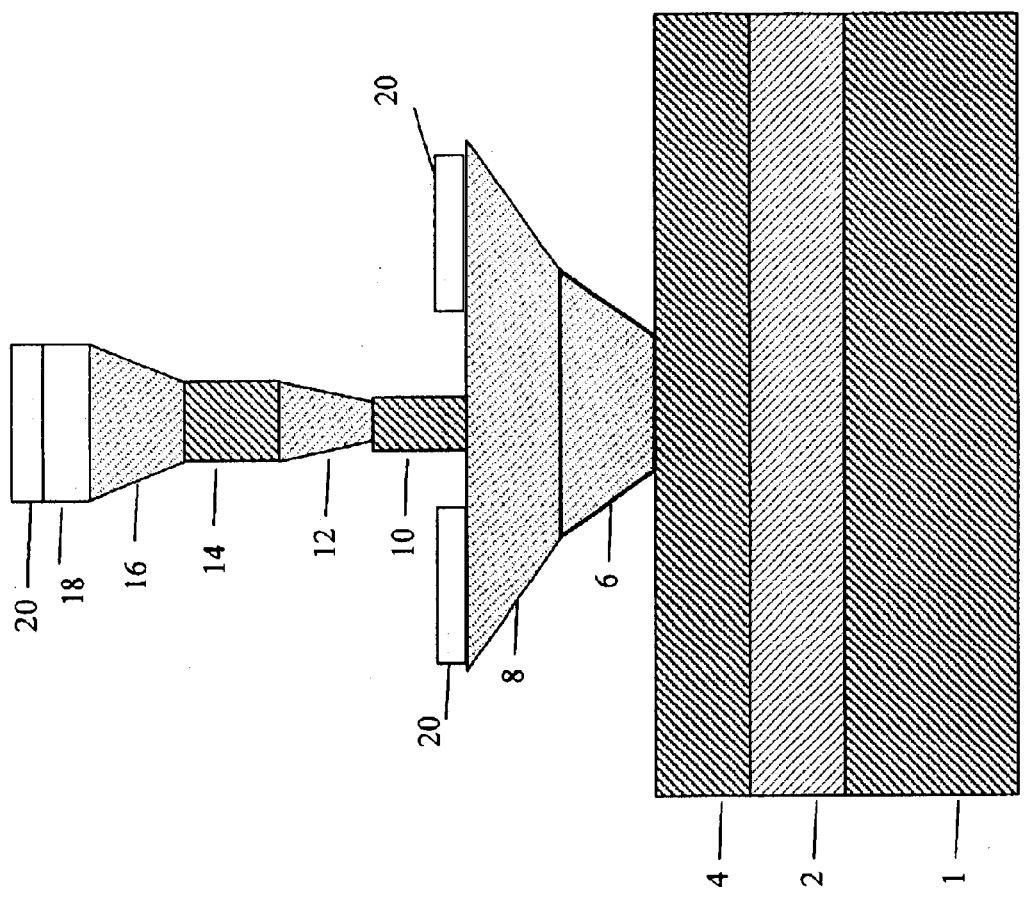
FIG. 2C illustrates the InGaAs base layer and InGaAs collector layer etch.
Figure 2D:
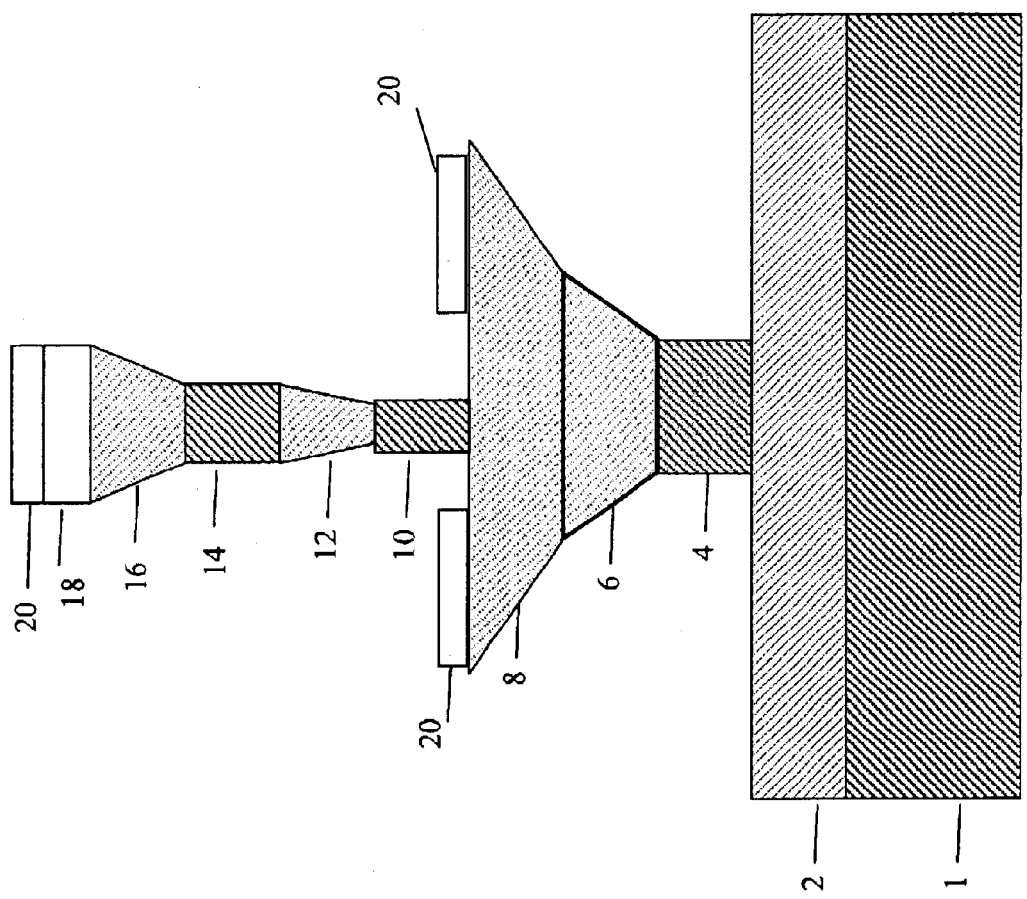
FIG. 2D illustrates the structure after removal of the InP collector etch-stop layer.
Figure 2E:
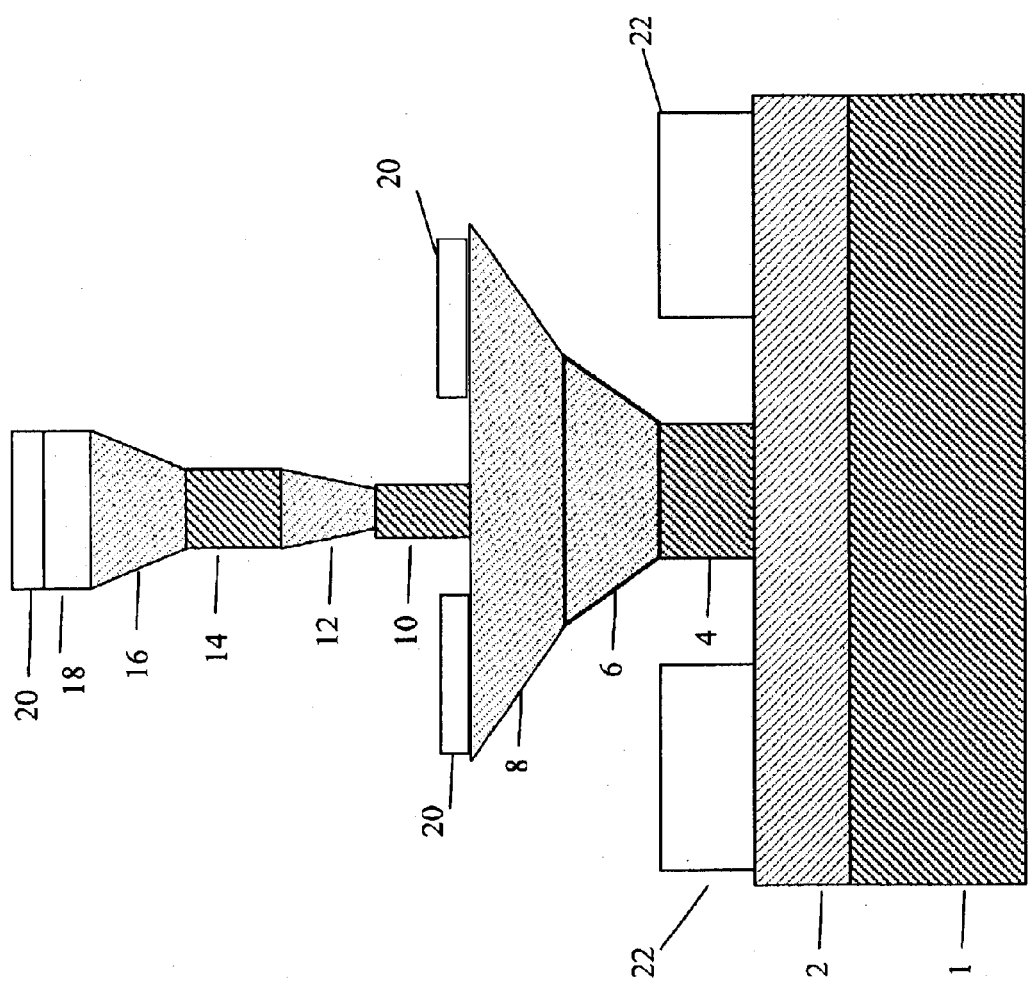
FIG. 2E illustrates a collector metal contact applied on the InGaAs sub-collector layer.
Figure 2F:
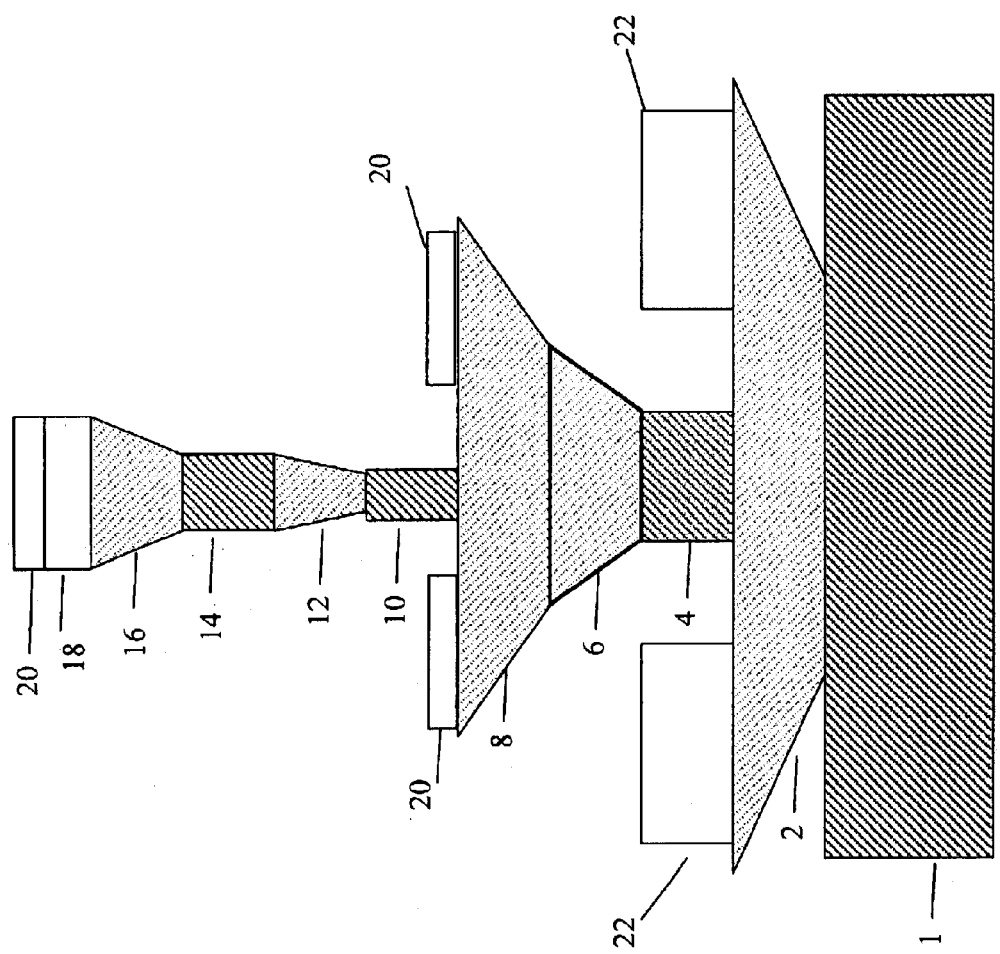
FIG. 2F illustrates the structure after removal of the InGaAs sub-collector that incorporates the principles of the present invention.

The base 8 and collector 6 etch is applied followed by the base contact formation. Again, the selective etching of InGaAs is achieved using citric-acid based solutions. The etching will stop automatically on the thin InP collector etch stop layer 4 as shown in FIG. 2C. The inserted InP collector etch-stop layer 4 provides a well-controlled etching depth during fabrication processing, and hence, this layer is crucial for device reproducibility since it improves the device performance uniformity. To facilitate the non-alloyed ohmic contact 20 on InGaAs using a metal, for example, Ti/Pt/Au, the etch-stop layer is removed using HCL-based solutions as shown in FIG. 2D. The collector metal contact 22 is then applied on InGaAs sub-collector layer 1 as shown in FIG. 2E. Finally, as shown in FIG. 2F, the sub-collector 2 is removed using selective wet-etching for device isolation purposes.

The ranges of the doping levels and thicknesses are shown in Table 2.

| Layer No. | Layer type | Thickness range (Å) | Type | Concentration (cm$^{-3}$) |
|---|---|---|---|---|
| 16 | emitter cap | 1,000–3,000 | N+ | 1E18–1E20 |
| 14 | emitter | 100–3,000 | N+ | 5E16–5E19 |
| 12 | emitter etch-stop | 10–100 | N | 5E16–5E19 |
| 10 | alloy-through emitter | 100–1,000 | N | 5E16–5E19 |
| 8 | base | 200–1,000 | P(carbon) | 1E19–1E20 |
| 6 | collector | 1,000–5,000 | N | 5E15–1E18 |
| 4 | collector etch-stop | 10–1,000 | N+ | 1E16–5E19 |
| 2 | sub-collector | 500–10,000 | N+ | 5E18–5E19 |
| 1 | InP substrate | | Semi-insulating | |

The applicable material systems of the present invention are not solely limited to InGaAs and InP. The layer structure can be applied to all InP-based HBTs, both single-heterojunction and double-heterojunction. The material of the emitter and the collector can be a binary compound such as InP, a ternary compound semiconductor such as InGaAs and indium aluminum arsenide (InAlAs), or a quaternary compound semiconductor such as aluminum gallium indium arsenide (AlGaInAs), gallium indium arsenide phosphide (GaInAsP), and gallium indium arsenide antimonide (GaInAsSb). The base layer material is not limited to InGaAs. Antimony-based materials such as gallium arsenide antimonide (GaAsSb) can be used as well. The layer structure has been developed for materials lattice-matched to an InP substrate, however, the use of strained layers on all material systems discussed above can be applied in the layer structure as well.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:
1. An indium phosphide heterojunction bipolar transistor layer structure formed on an InP substrate comprising:
a first InGaAs layer having a first doping concentration;
a first InP layer having a first doping concentration;
a second InGaAs layer;
a layer doped with carbon having a second doping concentration;
a second InP layer having a first doping concentration;
a third InGaAs layer having a first doping concentration;
a third InP layer having a first doping concentration; and
a fourth InGaAs layer.
2. The structure as in claim 1, further comprising a first contact on the fourth InGaAs layer.
3. The structure as in claim 1, further comprising a second contact formed on the second InP layer.
4. A method of making an indium phosphide heterojunction bipolar transistor layer structure on an InP substrate comprising:
forming a first InGaAs layer having a first doping concentration;
forming a first InP layer having a first doping concentration;
forming a second InGaAs layer;
forming a layer doped with carbon having a second doping concentration;
forming a second InP layer having a first doping concentration;
forming a third InGaAs layer having a first doping concentration;
forming a third InP layer having a first doping concentration; and
forming a fourth InGaAs layer.
5. The method as in claim 4, further comprising a first contact deposited on the fourth InGaAs layer.
6. The method as in claim 5, wherein the first contact is deposited by one of thermal or e-gun evaporation in a vacuum system.
7. The method as in claim 4, wherein the fourth InGaAs layer is etched using an acid-base solution.
8. The method as in claim 4, wherein the fourth InGaAs layer is etched using an acid-base solution.
9. The method as in claim 8, wherein one of citric-acid and sulfuric is used as the acid-based solution.
10. The method as in claim 8, wherein one of citric-acid and sulfuric is used as the acid-based solution.
11. The method as in claim 9, wherein the third InP layer is selectively etched.
12. The method as in claim 10, wherein the third InP layer is selectively etched.
13. The method as in claim 11, wherein the solution for selectively etching the third InP layer includes hydrochloric acid.
14. The method as in claim 12, wherein the solution for selectively etching the third InP layer includes hydrochloric acid.
15. The method as in claim 11, wherein the third InGaAs layer is etched.
16. The method as in claim 12, wherein the third InGaAs layer is etched.
17. The method as in claim 15, further comprising a second contact formed on the second InP layer.
18. The method as in claim 16, further comprising a second contact formed on the second InP layer.
19. The method as in claim 17, further comprising depositing a metal electrode on the second contact.
20. The method as in claim 18, further comprising evaporating a metal electrode on the second contact.

* * * * *